United States Patent

Bates et al.

[11] 4,021,292
[45] May 3, 1977

[54] TAPED BELT ELECTRONIC COMPONENT CENTERING DEVICE

[75] Inventors: Erwin Frederick Bates; Roy Marvin Whiting, both of Binghamton, N.Y.

[73] Assignee: Universal Instruments Corporation, Binghampton, N.Y.

[22] Filed: May 14, 1976

[21] Appl. No.: 686,503

[52] U.S. Cl. .............................. 156/552; 198/456; 198/634
[51] Int. Cl.² .................. B32B 31/04; B65B 47/24
[58] Field of Search .......... 156/552; 198/416, 456, 198/382, 634, 636

[56] References Cited

UNITED STATES PATENTS

| | | | |
|---|---|---|---|
| 2,771,176 | 11/1956 | Clark et al. | 198/636 |
| 3,089,576 | 5/1963 | Sauer et al. | 198/456 |
| 3,470,997 | 10/1969 | Trounce | 198/456 |
| 3,736,198 | 5/1973 | Leistner | 156/552 |

Primary Examiner—Douglas J. Drummond
Attorney, Agent, or Firm—Fidelman, Wolffe & Waldron

[57] ABSTRACT

A pair of pivoting, spring-loaded blades positioned in the path of travel of a series of electronic components on a continuous conveyor, center the components on the conveyor; and a plurality of free-moving fingers rest on the components in order to maintain a centered condition as the components are conveyed into the taping mechanism of a component taping machine.

5 Claims, 11 Drawing Figures

TAPED BELT ELECTRONIC COMPONENT CENTERING DEVICE

BACKGROUND

This invention relates to improved means for taping electronic components onto a continuous belt and, more specifically, to means for centering the components, whether of like kind or intermixed on the belt. Specifically, this invention centers the bodies of coaxial-leaded components and, without contacting the body, centers the lead forms of noncoaxial components.

The use of belted electronic components, (resistors, disc capacitors, diodes, etc.) has become in recent years one of the most convenient handling techniques for the electronics industry. The leads of components are prestraightened and generally aligned and equally spaced on the belt so that they may be fed directly into insertion machines or testing devices without intermediate handling. However, the speed and efficiency of subsequent operations using belted tapes is reduced and complexity is increased when the components are not precentered on the taped belt.

It is therefore an object of the present invention to provide improved means for centering a sequence of electronic components on a taped belt produced in an electronic component sequencing and taping machine.

Another object of the present invention is to provide improved means in an electronic component sequencing and taping machine for centering a sequence of electronic components regardless of the mix or sequence of components.

A specific object is to provide means for centering a sequence of non-coaxial leaded components using the lead forms thereon rather than centering relative to the body of the component or the ends of the leads thereof.

A further object of the present invention is to provide means for continuously maintaining the centered position, once achieved, of the component until the component is securely incorporated into a belt of taped components.

It is a specific object to provide means for maintaining the achieved centering of the component regardless of the shape of the component or the symmetry of the leads extending therefrom until the component is securely incorporated into a belt of electronic components.

It is a still further object of the present invention to provide simple, efficient and economic means for centering a sequence of individual electronic components moving on a conveyor and to maintain centering until the components are securely incorporated into a belt of taped components.

Another object of the present invention is to provide simple, efficient and economic means for lifting components from a moving conveyor and for providing firm initial contact between component leads and adhesive tapes so as to form a belt of taped components.

Still another object of the present invention is to provide simple, efficient and economic means for orienting the body attitude of sequenced electronic components on taped belts so as to provide a compact arrangement for reel storage of belts.

These and other objects together with a full understanding of the present invention will become apparent from the following detailed description of the invention when considered in conjunction with the accompanying drawing, wherein:

FIG. 9b is an elevational view of the electronic component of FIG. 9a.

Figure 1:
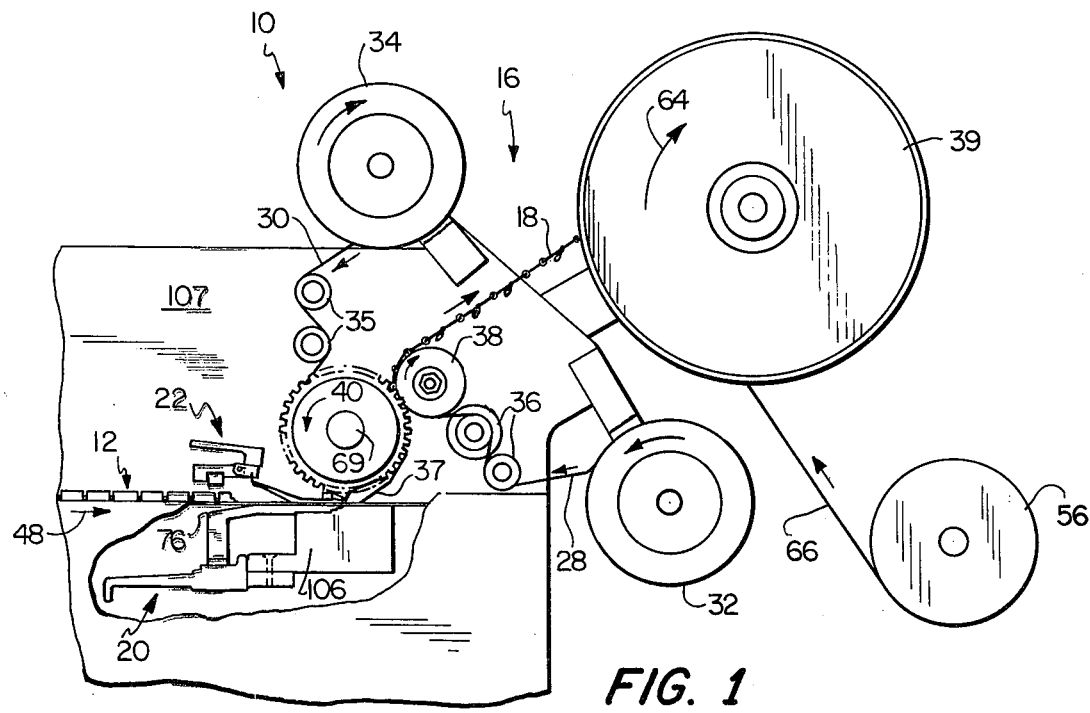
FIG. 1 is a front-elevational view of a portion of an electronic component taping machine showing, with parts omitted and cutaway, the centering and taping mechanism.
Figure 2:
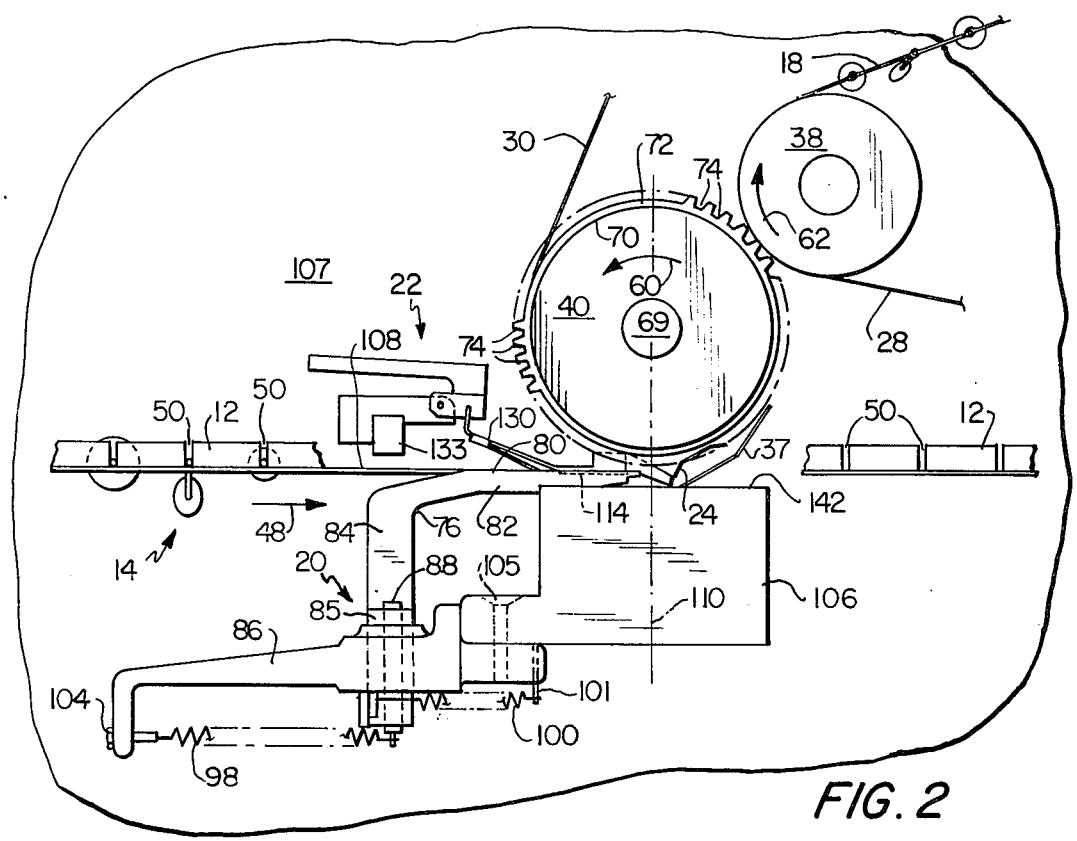
FIG. 2 is an enlarged front-elevational view, with parts omitted, or portions of the centering and taping mechanism of FIG. 1.

FIGS. 1 and 2 illustrate that portion of the improved component sequencing and taping machine 10 of the present invention illustrating the relationship between a component conveyor, generally shown as 12 carring electronic components 14, and a taping mechanism generally shown as 16. The taping mechanism 16 which lifts the components 14 from the conveyor 12 and incorporates them into a belt 18 of taped components is the novel portion of the machine 10 of this invention and comprises: a centering guide assembly 20 which laterally positions the components 14 on the moving conveyor 12 prior to taping; a hold-down assembly 22 which maintains the aforesaid centered condition of the electronic components 14 until the components are disengaged from the moving conveyor 12; a pair of lifting guides 24 which lift the electronic components 14, one at a time, from the moving conveyor 12 and guide them to, and press the component leads 26 against, moving adhesive tapes 30 whereon the components 14 adhere to form a taped belt 18 of components. The taping mechanism 16 is further comprised of a plurality of adhesive tape supply reels 32, 34; roller guides 35, 36 to direct the adhesive tapes 28, 30 to the taping heads 40 where contact is made with the leads 26 of the electronic components 14; an orienting plate 37 to further position the electronic components 14 on the tapes 28, 30; a pressure roller 38 to securely attach the electronic component leads 26 to the adhesive tapes 28, 30; and a take-up reel 39 to wind and store the taped belt 18 of components 14 leaving the pressure roller 38. (Arrows on FIGS. 1 and 2 indicate direction of motion of the above-mentioned tapes, reels, belt, etc.)

Additional elements and functions which comprise the machine 10 of this invention are known in the art and therefore are not described in the disclosure herein, and for the sake of clarity, have been omitted from the drawings. Among the omitted functions and elements are the electronic component feed and sequencing mechanisms which position electronic components 14 of the desired type automatically on the moving conveyor 12 in any desired sequence and mixture and with the component leads 26 aligned and cut to proper length prior to conveyance of these electronic components 14 to the taping mechanism 16. Also, among the functions and elements omitted from the specifications which follow is a detailed description of the control and memory systems which govern, for example; start and stop; rates of component feed; conveyor speed; and spacing, sequencing and mixing of components. All of these functions and elements, known in the art, are exemplified in U.S. Pat. No. 3,421,284; to which, for example, the novel mechanisms of this disclosure may be readily adapted.

Figure 3:
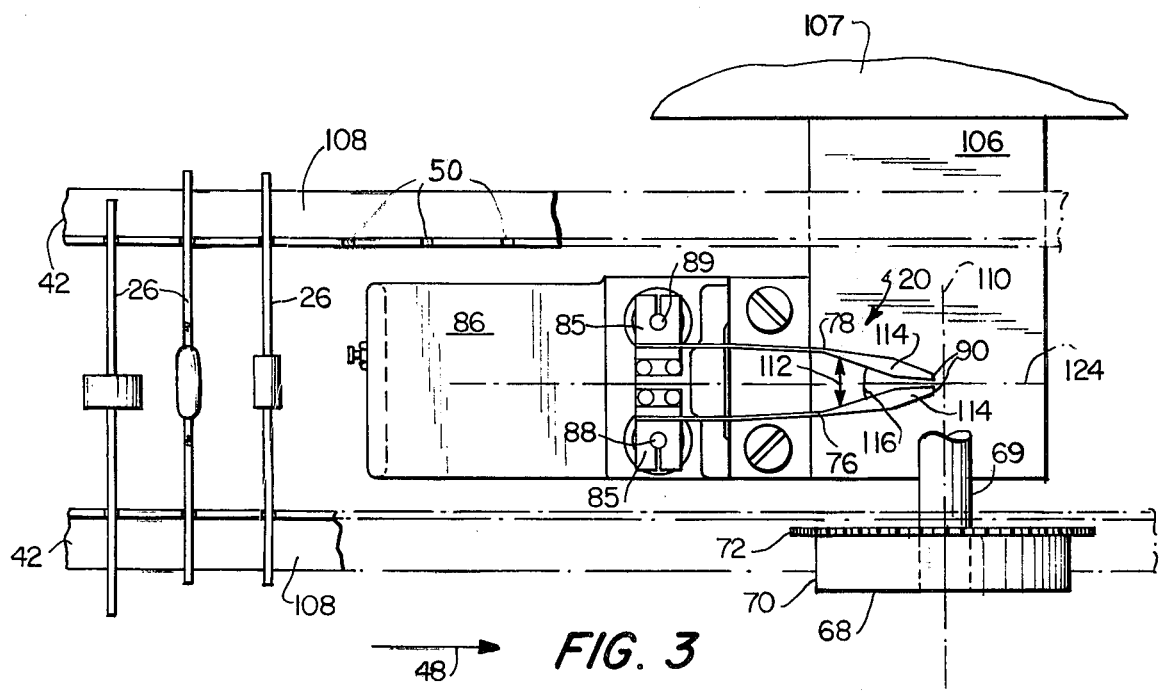
FIG. 3 is an enlarged plan view, with parts omitted, of the centering and taping mechanism of FIG. 2.

Referring particularly to FIGS. 1, 2 and 3, the conveyor 12 includes a pair of spaced apart endless L-shaped belts 42 which are driven by motive means (not shown) in the direction generally indicated by the arrow 48. The L-shaped conveyor belts 42 are formed with spaced pairs of opposed slots 50 which are adapted to removably receive wire leads 26 of electronic components 14, such that the longitudinal axes of the component leads 26 lie generally transverse to the direction of travel 48 of the conveyor 12.

The taping mechanism 16 includes a pair of taping heads 40; a pressure roller 38; a pair of tape supply reels 32, 34; a powered take-up reel 39, as aforesaid; and a separating web supply reel 56. Suitable rollers 35, 36 guide the tapes 28, 30 from the supply reels 32, 34 to the pair of taping heads 40. The taping heads 40 and the pressure roller 38 are driven as indicated by the arrows 60 and 62 respectively be means, not shown, to draw the tapes 28, 30 from the tape supply reels 32, 34. The speed of the taping heads 40 may be varied in relation to the speed of the conveyor 12 and in conjunction with various pitches of slots 54 in flange 72 of taping heads 40 to control the spacing between components 14 which are secured on the tapes 28, 30. Also, takeup reel 39 is driven in the direction indicated by the arrow 64 by any suitable means, such as an electric motor (not shown) to withdraw a separating web 66 from the web supply reel 56 and to wind up the taped belt 18. The separating web 66 separates the turns of the taped belt 18 as wound upon the take-up reel 39 and prevents frictional contact and interlocking between the components 14 of adjacent turns.

Each of the pair of taping heads 40 is comprised of one of two discs 68 spaced apart and fixed to rotate with a common horizontal drive shaft 69 oriented transverse to the direction of conveyor travel 48. The circumferential surfaces 70 of the disc 68 are generally smooth and an annular flange 72 extends from the inner edge of the circumferential surface 70. Each of the flanges 72 is provided with equally spaced slots 74, the slots 74 of each flange 72 being aligned axially of the drive shaft 69. The slots 74 function to support and maintain the relative positioning of the leads 26 of a component 14 during the taping operation.

Synchronizing means, not shown, control the relationship between the linear motion of the conveyor 12 and the rotational motion of the taping head discs 68 such that the taping head slots 74 engage the leads 26 of the electronic components 14 as they are lifted by the lifting guides 24 from their resting place in the slots 50 of the moving conveyor 12 as explained hereinafter.

The width of the flange surfaces 70 are adapted to accommodate the width of the adhesive tapes 30 from the supply reel 34, which tapes 30 thread around the generally lower portions of the taping head discs 68, with an individual tape 30 running on each disc surface 70.

Figure 5:
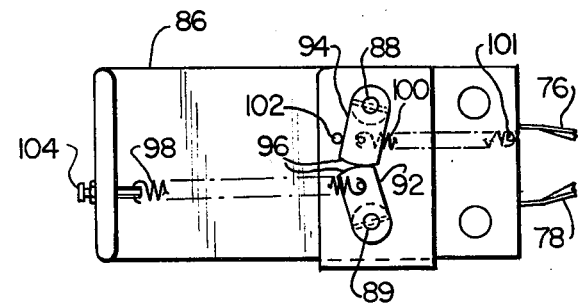
FIG. 5 is a bottom view, with parts omitted and cutaway, of the centering device of FIG. 2.

The centering guide assembly 20 (FIG. 3) is comprised of a pair of generally L shaped guide blades 76, 78 positioned approximately equidistant between the L shaped conveyor belts 42. The L-shaped guide blades 76, 78 are oriented (FIG. 2) with the longer legs 82 generally horizontal and the shorter legs 84 depending verically therefrom. The vertical legs 84 bend outward at the lower end to form horizontal flanges 85 which pivot on support member 86 by means of vertical pins 88, 89 rigidly attached to the flanges 85 and located such that there is symmetry of the guide blades 76, 78 between the conveyor belts 42 as seen in the plan view (FIG. 2). The free ends 90 of the guide blades 76, 78 extend from the pivots in the direction 48 of conveyor motion and are able to swing apart, pivoting on the pins 88, 89. The pivot pins 88, 89 extend below the support member 86 where (FIG. 5) short radial arms 92, 94 fixedly attached, extend equally, one from each pivot pin 88, 89. The outer edges 96 of the arms have equal circular curvatures and the arm lengths are such that there is rolling contact between the arms 92, 94 when the guide blades 76, 78 swing from their most closed to their most separated positions. Interlocked ridges, or teeth (not shown), on the outer edges 96 of the arms prevents slippage between the arms 92, 94 so that the swinging motion of the two blades 76, 78 is always equal in magnitude and in opposite directions, i.e., the blades swing inwardly or apart in unison.

A bias spring 98, connected between one pivoted arm 92 and the support member 86, is tensioned to draw the blades 76, 78 together. A weaker bias spring 100 connected between the other pivoted arm 94 and the support member 86, via a pin 101, is tensioned to cause the blades 76, 78 to separate. Thus, the net force exerted by the stronger spring 98 causes the guide blades to be at the closest position when the machine is nonoperating. Contact between the blades 76, 78 is prevented by a mechanical stop 102 fixed to the support member 86 which limits the travel of the pivoted arm 94. Tension in the stronger spring 98 is varied by means of an adjusting screw 104 such that the force required to spread the guide blades 76, 78 apart may be maintained as required, e.g. when a spring is replaced.

The juxtaposed guide blades 76, 78 bend inwardly toward each other (FIG. 3) providing a gradual reduction (diminishing in the direction of conveyor travel 48) in the space 112 between them. A bend in the blades 76, 78 near the free ends 90 provides horizontal flange surfaces 114 extending symmetrically toward each other which surfaces 114 extend back from the blade ends 90 approximately one-third the length of the blades 76, 78; the contour of the inner edges 116 of the flanges 114 increases the rate of closure of the space 112 between the blades 76, 78.

The support member 86 and, thus, the fixedly attached centering guide assembly 20 is rigidly fastened in any suitable manner, e.g., bolts 105, to an extension 106 from the main structure 107 of the machine 10 of this invention, so that the upper edges and surfaces 80, 114 of the blades 76, 78 are generally horizontal and substantially coplanar with the horizontal elements 108 of the L-shaped conveyor belts 42; and the free ends 90 of the guide blades 76, 78 extend approximately to the projected vertical centerlines 110 of the taping heads 40. All electronic components 14 moving with the conveyor 12 pass the centering guide assembly 20 prior to reaching the taping heads 40.

Figure 6:
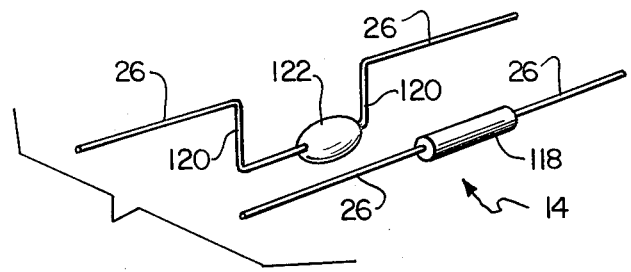
FIG. 6 illustrates electronic components of the type used with the mechanism of FIG. 1.

When the conveyor 12 is empty of electronic components 14, movement of the conveyor 12 causes no interaction with the centering blades 76, 78. However, when an electronic component 14 is carried between the L-shaped belts 42 with the leads 26 resting in a pair of opposed conveyor slots 50, a portion of the component 14 extends (FIG. 2) below the level of the horizontal surfaces 80, 114 on the centering blades 76, 78. Then that depending portion of the component 14 will come into contact with the centering blades 76, 78 as the component 14 moves on the conveyor 12. The part or parts of a component 14 which depend and therefor contact the centering blades 76, 78 are either the body 118 of a component 14 with coaxial leads 26 or the formed portion 120 of the leads 26 on a component 14 such as a disc capacitor 122 (FIG. 6) where the functional body 122 depends substantially below the horizontal blade surfaces 80, 114 as the component leads 26 rest in the conveyor slots 50.

When a component 14 is centered between the L-shaped belts 42, contact is made substantially simultaneously with both centering blades 76, 78. However, when the component 14 is offcenter between the L-shaped belts 42, contact will be made first with one centering blade, e.g. the lower blade 76 when the component is below center (as viewed in FIG. 3). Because the resistance to lateral sliding of the component leads 26 in the conveyor slots 50 is less than the force of the springs 98, 100 restraining the centering blades 76, 78, the moving component 14 is forced toward the centerline 124 of the pair of blades 76, 78 by reaction of the blade edge 116 against the depending portion of the component 14. After the component 14 is centered, continuous component contact is made with both centering blades 76, 78; and as the conveyor 12 progresses, the component 14 forces the centering blades 76, 78 apart following the component 14 to pass between. It should be noted (FIG. 6) that an axial leaded component 14, such as a resistor, is 'centered' when the resistor body 118 is centered transversely over the centerline 124 of the blades 76, 78. A depending component 14, such as a disc capacitor body 122 is 'centered' when the non-horizontal lead segments 120 are substantially equidistant from the centerline 124 of the blades 76, 78 regardless of the location of the geometric center of the component 14; centering is accomplished on the lead forms 120 and not the body 122 of the depending component 14.

Figure 7:
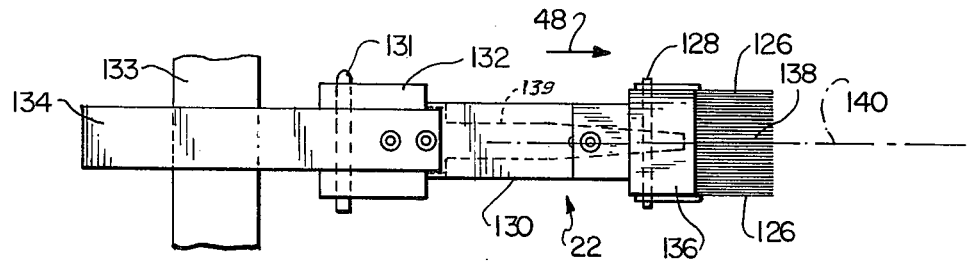
FIG. 7 is a top plan view, to an enlarged scale, of the hold down assembly of the mechanism of FIG. 1.
Figure 8:
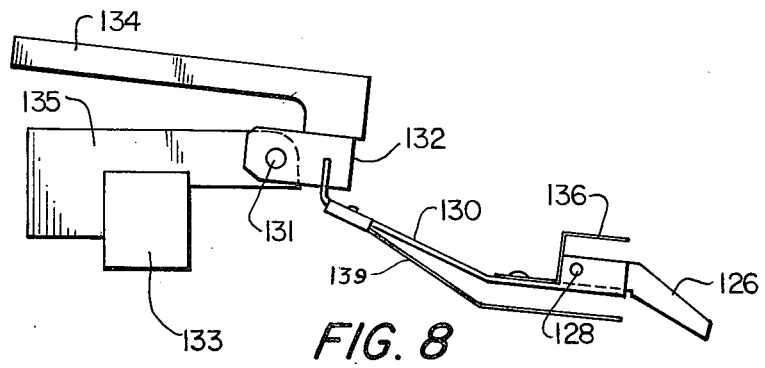
FIG. 8 is the front-elevational view of the hold-down assembly of FIG. 7.
Figure 10:
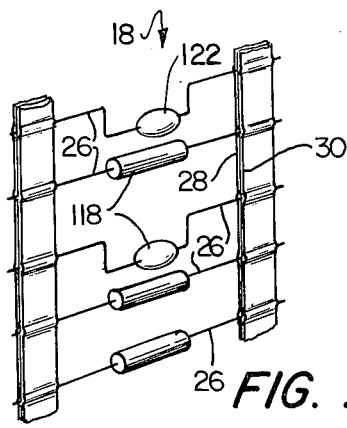
FIG. 10 illustrates a taped belt of intermixed electronic components.
Figure 9A:
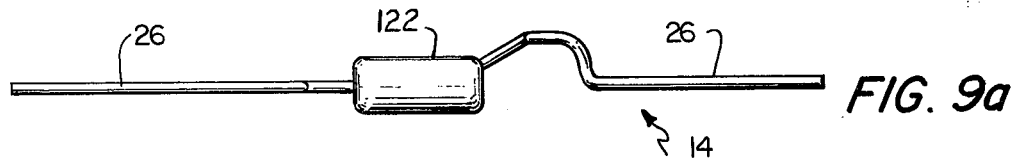
FIG. 9a is the top view, to an enlarged scale, of an electronic component with asymmetric lead forms.
Figure 9B:
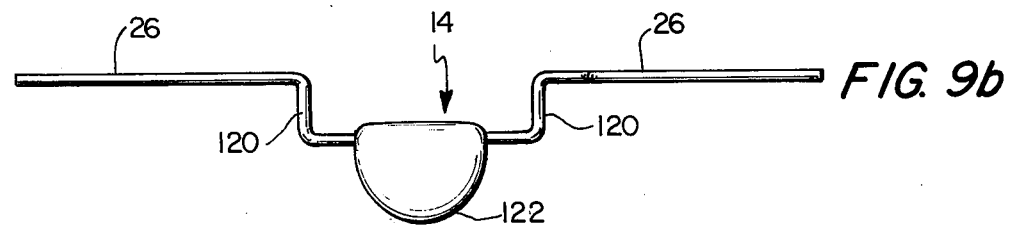
Figure 4:
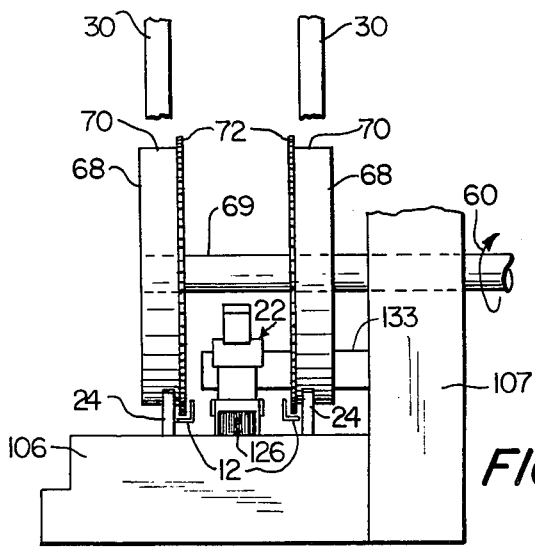
FIG. 4 is a right side view, with parts omitted and cutaway, of the mechanism of FIG. 1.

The hold-down assembly 22, (FIGS. 2, 7, 8) which first acts upon the centered component 14 prior to release of the component by the centering blades 76, 78 is comprised of a plurality of juxtaposed fingers 126 loosely pivoted at one end on a horizontal pin 128 which in turn is supported at on end of a bent elongated arm 130. The other end of this arm 130 engages a clevis 132 pivotally supported by a pin 131 and bracket 135 to an extension 133 from the main machine structure 107; a counterweight 134 atop the clevis 132 reduces the downward force exerted by the hold-down arm 130 and the fingers 126. An elongated depressor blade 139 extends longitudinally beneath the arm 130 and is attached, e.g., riveted, thereto at one end adjacent the clevis 132 to provide a cantilevered suspension of the blade 139. The depressor blade is flexible and fabricated of spring quality material, e.g., beryllium copper, 0.011 inches thick. A guard 136 attached to the elongated arm 130 limits the upward travel of the pivotally mounted fingers 126. These fingers 126 are preferably fabricated of thin rigid material and are mounted with the line of contact 138 between adjacent fingers 126 oriented parallel to the direction 48 of conveyor travel, and the centerline 140 of the stack of fingers 126 is vertically aligned with the center line 124 of the pair of centering blades 76, 78. In an embodiment of this invention, forty-seven beryllium copper fingers 126, 0.014 inches thick, performed satisfactorily. When no component 14 is passing through the centering blades 76, 78 the fingers 126 depend from the pivot pin 128 extending below the level of the horizontal surfaces 80, 114 of the blades 76, 78. As components 14 moving in turn on the conveyor 12 near the free ends 90 of the centering blades 76, 78, the fingers 126 rest in turn on bodies 118, 122 of the successive components. The free pivoting and thinness of the fingers 126 allow the fingers 126 to rise up to conform with the contours of the centered component body passing beneath. The weight of the fingers 126 on the component bodies 118, 122 assures that the components in turn remain centered after emerging from between the centering blades 76, 78 and until engaged by the lifting guides 24. Depending components 14, centered by contact of the lead forms 120 with the centering blades 76, 78, are retained by the fingers 126 in the centered position even when the leads 26 are displaced relative to each other as would be seen in a plan view. With such a component 14, (FIGS. 9a and 9b are plan and elevation views respectively illustrating such a component) were it not for the downward pressure exerted by the fingers 126, the forward lead would come off the centering blades 76, 78 before the following lead and the force of the spring loaded blade on the following lead would force the component off center.

The depressor blade 139 presses down upon components 14 as they move between the centering blades 76, 78 and prevents the components from riding up and over the blades 76, 78 as they might otherwise tend to do because of the force of the springloaded centering blades 76, 78.

A pair of thin, flexible lifting guides 24, preferably made of spring quality sheet metal, e.g. berylium copper, .010 inches thick, are attached to a horizontal surface 142 of the extension 106 from the main structure 107 of the machine 10 of this invention. Each guide 24 extends above the horizontal surface 142 in a generally arcuate contour with the convex surface of said guide 24 adjacent and generally tangent with the surface 70 of a taping head disc 68. The position of the lifting guides 24 intercepts the path of travel of leads 26 of electronic components 14 which leads 26 extend outward (FIG. 3) at both sides from the slots 50 in the L-shaped belts 42. The leads 26 are forced by the conveyors continued motion 48 up the generally convex surfaces of the blades 24 until the leads 26 recess into slots 74 in the extended flange 72 of the taping head disc 68. The lifting guides 24 elastically deformed by the leads press the component leads 26 onto the exposed adhesive surfaces of the tapes 30 running on surface 70 around the lower circumference of the disc 68 whereby the leads 26 are retained in position on the tapes 30.

The positional relationship between the ends 90 of the centering blades 76, 78, the hold-down fingers 126, the conveyor 12 and taping heads 40 are such that a component 14 centered by the centering blades 76, 78 is restrained in position by the hold-down fingers 126 before contact between component 14 and centering blades 76, 78 terminates. Also, the component 14 is lifted from the conveyor slot 50 by the lifting blades 24 and engaged in the slots 74 of the taping head flanges 72 prior to release from the downward pressure of the fingers 126. Thus, a component 14, once centered, is controlled until it is stuck onto the adhesive tapes 30.

The orienting plate 37, preferably made of spring quality sheet metal, e.g. berylium copper, 0.005 inches thick and 0.5 inches wide, secured to the extension 106 of the main structure 107 and located forward of the discs 68 of the taping heads 40 presses against the bodies 118, 122 of passing components 14. The force exerted by the orienting plate 37 turns dependent bodies, e.g. bodies 122 of those components without coaxial leads, toward the taping heads 40, thus producing a flatter taped component belt 18 and more compact storage of the belt 18 on the take-up reel 39. The orienting plate 37 acts on the components 14 prior to the action of the pressure roller 38 in applying the second tapes 28 in the known manner to the component leads 26.

In operation of the machine 10 of this invention, a series of electronic components 14 move with the conveyor 12 from the sequencer (not shown) where the components were deposited, by knowns means, on the conveyor belts 42 in any desired sequence and mix of component type and size. The component leads 26 rest in the slots 50 of the L-shaped conveyor belts 42 and extend outwardly therefrom transversely to the direction 48 of conveyor motion. The conveyed components 14 engage the spring-loaded centering blades 76, 78 positioned in the path of component travel and are centered between the L-shaped belts 42. The hold-down fingers 126 press from above on the components 14, contacting the body, after the components have been centered and maintain the centered position of the components 14 until the leads 26 engage the lifting guides 24 which force the leads 26 upward and out of the conveyor slots 50 and into the slots 74 of the taping head flanges 72. A pair of narrow adhesive tapes 30, e.g. in the order of .3 inches wide, are threaded from the supply reel 34 over guide and tensioning rollers 35, around the lower circumference of the rotating taping head discs 68, resting on the flat surfaces 70. Then the tapes pass between the taping discs 68 and the rotating pressure roller 38 and are wound up on the take-up reel 39. A second pair of similar tapes 28 are threaded from the supply reel 32 over guide and tensioning rollers 36; beneath the pressure roller 38; between the pressure roller 38 and the taping discs 68; and then are wound up on the take-up reel 39.

As the electronic components 14 move upward carried in the slots 74 of the taping discs 68, the lifting guides 24 press the component leads 26 against the adhesive tapes 30 riding on the generally flat surfaces 70 of the discs 68. The orienting plate 27 forces dependent component bodies, e.g. a capacitor body, toward the discs 68 and the second tapes 28 are then applied over the component leads 26 in the known manner as the leads 26 pass between the pressure roller 38 and taping discs 68. Thus, a taped belt 18 of centered electronic components 14, with electronic leads 26 firmly sandwiched between two pairs of adhesive tapes 28, 30 emerges to be wound on the storage reel 39 with a separating web 66 interspaced between turns.

What is claimed is:

1. In an electronic component taping machine including:
   conveyor means for transporting constrained, leaded electronic components on said conveyor in any preferred sequence, lead portions of said components resting on said conveyor means in substantially prestraightened condition and in a common plane where constrained by said conveyor;
   lifting means for removing said components from said conveyor means prior to taping; and including a taping means for applying adhesive tape to the leads of said components so as to form an ordered belt of taped electronic components; and
   the improvement therein comprising a device to center said components on said conveyor means, said centering device compared of a pair of juxtaposed elongated blades centered over said conveyor means and oriented in the direction of travel of said components, each of said blades pivoted at one end, the other end of said blades, when pushed, swinging apart in unison and in symmetric motion in opposition to a biasing force tending to bring said blades together, the upper surfaces of said blades generally coplanar and substantially adjacent said coplanar lead portions of said components moving on said conveyor means, the spacing between said blades sufficient at said pivoted ends to allow entrance therebetween of dependent portions of said leaded electronic components moving on said conveyor means, said spacing between blades diminishing in the direction of component motion and causing interference contact between said blades and said dependent portions, said dependent portions, moving with said conveyor means, exerting forces on said blades when contact occurs therebetween, the force of contact with one blade translating said component transversely to the direction of conveyor travel, the force of contact with two blades pivoting said blades apart allowing said dependent portion to pass therebetween, said biasing force thereafter returning said blades to a closed position.

2. The electronic component taping machine of claim 1, the further improvement therein being a hold-down mechanism maintaining the centered condition of said dependent portions of said electronic components, said centered condition produced by said centering device, and said hold-down mechanism centered over said conveyor means and contacting the bodies, one at a time, of said moving electronic components, said hold-down mechanism constrained from horizontal motion transverse to the direction of motion of said components and preventing motion of said components transverse to the direction of said conveyor.

3. The electronic component taping machine of claim 2 wherein the hold-down mechanism after contact rests upon each component body in turn maintaining said centered condition of said dependent portions of said components by the applied weight of said hold-down mechanism, said contact between said component body and said hold-down mechanism initially occurring while said dependent portions of said components are contacting both blades of said centering device.

4. The electronic component taping machine of claim 3 wherein said hold-down mechanism is comprised of a plurality of thin juxtaposed fingers, pivoting independently from one end about a common horizontal pin, said pivot pin oriented transversely to the direction of motion of said components, said pivot pin constrained from motion in said transverse direction, said fingers constrained from lateral motion along said pin, the other end of each of said fingers extending from and depending from said pivot pin such that said other ends rest below said common plane of said component leaving such that the bodies of said components moving on said conveyor contact said pivoted fingers, the individual fingers rising to continuously match the contours of said component bodies moving therebeneath, and said fingers returning to rest below said common plane after passage of said component bodies.

5. The electronic component taping machine of claim 2, the further improvement therein being a flexible depressor blade, said depressor blade centered over said conveyor means and elastically contacting and exerting a downward force on the moving electronic components prior to the action on said components of said hold-down mechanism and preventing vertical motion of said components during the action of said centering device.

* * * * *